United States Patent [19] [11] 4,046,444
Brorein [45] Sept. 6, 1977

[54] CONNECTOR FOR USE WITH PRINTED WIRING CIRCUITS

[75] Inventor: William J. Brorein, Whippany, N.J.

[73] Assignee: General Cable Corporation, Greenwich, Conn.

[21] Appl. No.: 622,064

[22] Filed: Oct. 14, 1975

[51] Int. Cl.[2] ........................ H01R 13/54; H05K 1/07
[52] U.S. Cl. ............................... 339/91 R; 339/17 L; 339/176 MP
[58] Field of Search .............. 339/17 L, 17 LC, 91 R, 339/75 MP, 184 M, 176 MP

[56] References Cited

U.S. PATENT DOCUMENTS

| | | | |
|---|---|---|---|
| 3,365,694 | 1/1968 | Parker | 339/91 R X |
| 3,748,631 | 7/1973 | Brorein | 339/17 L X |
| 3,867,000 | 2/1975 | Michalak et al. | 339/91 R X |

*Primary Examiner*—Roy Lake
*Assistant Examiner*—E. F. Desmond
*Attorney, Agent, or Firm*—Roy C. Hopgood; John M. Calimafde; Charles W. Neill

[57] ABSTRACT

This cord connector for printed wiring cards is self-latching to the printed wiring card so that the conventional hold down screws are no longer necessary. The shell halves that protect the connector contacts are interlocking to facilitate the original assembly of the connector.

10 Claims, 6 Drawing Figures

CONNECTOR FOR USE WITH PRINTED WIRING CIRCUITS

RELATED PATENT

This specification describes an improvement on the cord connector for printed wiring cards disclosed in U.S. Pat. No. 3,748,631, issued July 24, 1973.

BACKGROUND AND SUMMARY OF THE INVENTION

Printed wiring cards have edge portions with a multitude of contacts extending generally parallel to one another and commonly located on both sides of the card along the same edge. The connector that is used with the card has a cord with a plurality of conductors which are terminated at the respective contacts of the connector; these contacts being in position to touch the different contacts of the printed wiring card when the connector is in position on the edge of the wiring card.

It has been the conventional practice to have interferences located in such positions that the connector cannot be assembled with the card except in one position which locates the proper contacts of the connector over or under the corresponding contacts of the printed wiring card. Prior art connectors have been held in place by screws. The connector of the present invention is constructed so that it is self latching to the printed wiring card and screw connections are no longer necessary. This greatly shortens the time required for assembly and disassembly of a connector with a printed wiring card.

The connector has a shell for protecting the contacts. This shell is made in two halves which are assembled when the connector is manufactured and the shell is constructed so that it is open on one side to admit the edge of a printed wiring circuit card into contact with the contact in the connector. It is another feature of the present invention that the halves of the connector shell are interlocking. This facilitates the manufacture of the connector by cutting down the time required for its assembly.

Other objects, features and advantages of the invention will appear or be pointed out as the description proceeds.

DESCRIPTION OF PREFERRED EMBODIMENT

Figure 1:
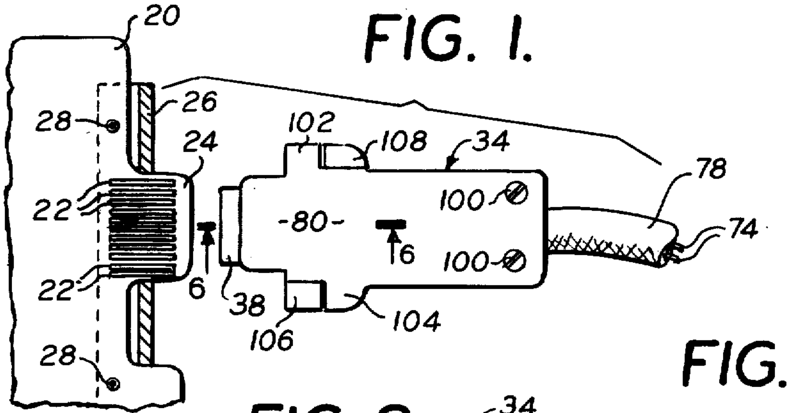
FIG. 1 is a diagrammatic view, partly in section, showing an edge portion of a printed wiring circuit card and a connector, adjacent to the contact edge of the card and in position to be pushed over the edge of the card to establish the circuits between the card and connector.

FIG. 1 illustrates a printed wiring card 20 which has circuits on its surface terminating at a number of conductor strips 22 which extend in parallel relation outward towards the end of a tab 24 which projects from the edge of the card 20. Only the conductor strips 22 are shown in FIG. 1 since the illustration of the other parts of the circuits are not necessary for a complete understanding of this invention. There are similar parallel conductor strips 22' on the underside of the card 20.

The card 20 has a handle portion 26 which is connected to the card 20 by suitable fastening means such as rivets 28.

The handle 26 has a cut out portion 36 (FIG. 6) for receiving a tongue 38 of a connector 34. This tongue 38 is a polarizing tongue and it insures that the connector 34 is applied over the tab 24 with the right orientation. For example, the tongue 38 is thin enough to extend through the cut out section 36; but if the connector 34 is applied to the card 20 in an upside down position, there is a much thicker tongue 40, of the connector 38, which is too thick to extend through the cut out section 36.

Figure 6:
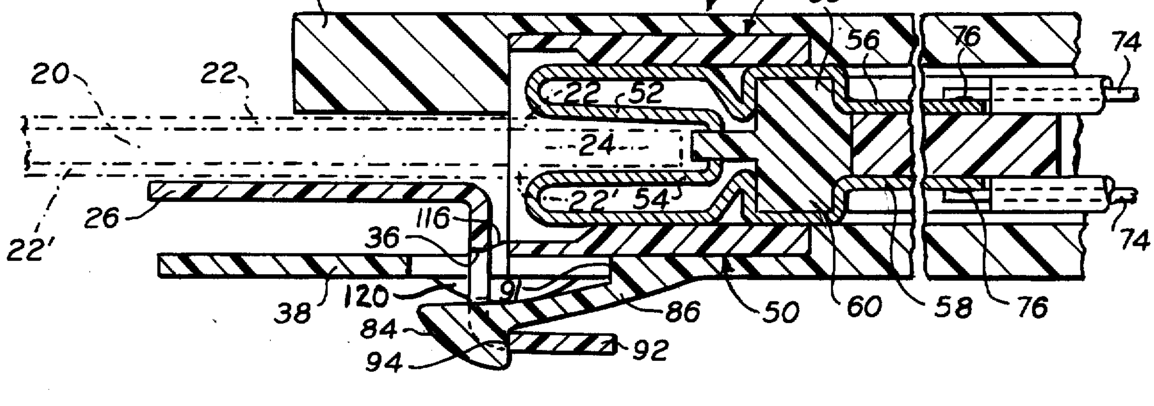
FIG. 6 is a greatly enlarged sectional view taken on the line 6—6 of FIG. 1 but with the connector shown assembled with the handle portion of the card and with the rest of the card shown in phantom for clearer illustration of the interlock feature.

FIG. 6 also shows the internal construction of the connector 34. There is a connector body 50 which is preferably one piece of plastic material. Within the connector body 50 there are upper contacts 52 which are ranged in parallel relation with one another corresponding to the contacts 22 (FIG. 1) of the printed wiring card 20. These contacts 52 touch the conductor strips 22 on the top surface of the card 20. For the printed circuit card shown in this application the connector body 50 also has lower contacts 54 (FIG. 6) similar to the upper contacts 52 but in a position to touch conductor strips 22' on the bottom surface of the card 20.

The upper contacts 52 are formed by folding back the forward ends of connectors 56 which extend through an end wall 60 of the connector body 50 and for some distance beyond the end wall 60. This end wall 60 is preferably a one piece construction with the rest of the connector body 50 but in the construction illustrated it is an inserted piece, as shown in FIG. 6 and it is assembled with the connector body 50 as a unitary construction with a row of openings for the upper connectors 56 to extend through, and the connectors 56 are formed so that they are bent against the inner and outer faces of the end wall 60 to hold the connectors 56 against displacement in the direction of their longitudinal extent. The lower contacts 54 are similarly formed by folding back the end portions of lower connectors 58 which extend through openings in the end wall 60 as shown in FIG. 6.

When the tab 24 of the printed circuit card 20 is inserted into the connector body 50, the conductor strips 22 on the tab 24 displace the contacts 52 and 54 away from one another so that the spring tension of these contacts holds them firmly against the conductor strips 22 on the card.

The connectors 56 and 58 extend for a substantial distance beyond the back wall 60 and there are conductors 74 connected with the different connectors 56 and 58, preferably by soldered connectors 76. A more detailed description of this construction is included in U.S. Pat. No. 3,748,631 but such description is unnecessary for a complete understanding of the improved structure of the connector of this invention.

The connector assembly 34 has an outer shell for protecting the connector body 50 and the contacts 52 and 54 and the conductors 56 and 58 as well as the conductors 74 which are as numerous as the conductor strips 22 of the card 20, and which are part of a main cable 78.

Figure 2:
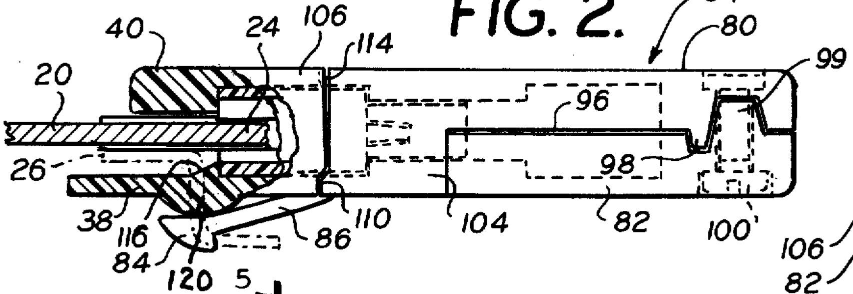
FIG. 2 is an enlarged end view, partly broken away and partly in section, showing the connector of FIG. 1 in contact with the card shown in FIG. 1.
Figure 4:
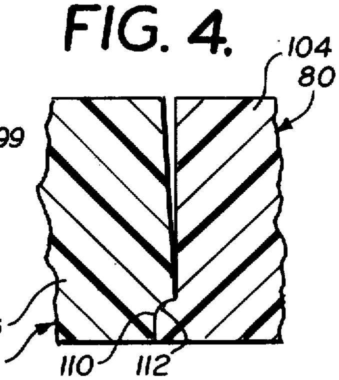
FIG. 4 is an enlarged, fragmentary sectional view taken on the line 4—4 of FIG. 3.

The shell that encloses the interior parts of the connector 34 includes an upper half 80 and a lower half 82 (FIG. 2). The lower half 82, which is shown in bottom plan view in FIG. 3, has a latch 84 connected to the rest of the lower half 82 by a tongue 86. The latch 84 and tongue 86 are preferably of one piece construction with the remainder of the lower half 82. The tongue 86 connects with the adjacent part of the lower half 82 along a hinge line 88. Around all other parts of the latch 84 and tongue 86, the tongue and latch are separated from the adjacent parts of the lower half 82 along a space 90 which is shown as a uniform spacing in the plan view of FIG. 3. However, the lower half is molded with the tongue 86 and latch 84 extending downward as shown in FIG. 2 so that when the latch 84 is pushed upward toward the portion of the lower shell 82 above it, the tongue 86 serves as a resilient element to urge the latch 84 downward. A small wedge 91 integral with the inside of the latch tongue presses against the connector body, thus increasing the outward spring force of the tongue; and this wedge also stiffens the tongue, to prevent unlatching without the use of a tool.

The connector shell will withstand high impact and other severe forces, thus providing protection for the entire assembly. Suitable materials are poly-carbonate, polyester, nylon, acetals and the like.

Referring to FIG. 6, when the tongue 38 is inserted through the cut-out section 36, the latch 84 contacts with the rearward end 92 of the handle portion 26. This raises the latch 84 so that it moves across the top of the lower end of the handle portion and engages behind a shoulder 94 which constitutes the lower end of the cut-out section 36. This holds the connector engaged with the card 20.

The upper half 80 and lower half 82 of the protecting shell of the connector 34 meet with one another along a middle boundary 96. Neither of the halves of the shell extend above or below this boundary 96 except at regions where the upper and lower halves interlock with one another.

The first region of interlock is at the rearward end of the connector 34 where there are horizontally extending ridges 98 and 99 which interlock to prevent relative movement of the upper and lower halves in the direction of the length of the connector. At this rearward end of the connector, there are bolts 100 which hold the upper half 80 and lower half 82 firmly clamped together.

The forward ends of the upper half 80 and lower half 82 connect together by interlocks which do not require any fastening means. This construction is shown in FIGS. 1 - 5. FIG. 1 is a top plan view of the upper half 80; and it is shown with a first extension 102 and a second extension 104 which are integral and preferably one piece with the upper half 80 and which extend all the way to the bottom of the lower half 82. FIG. 2 shows the extension 104 projecting to the level of the bottom surface of the lower half 82.

Figure 3:
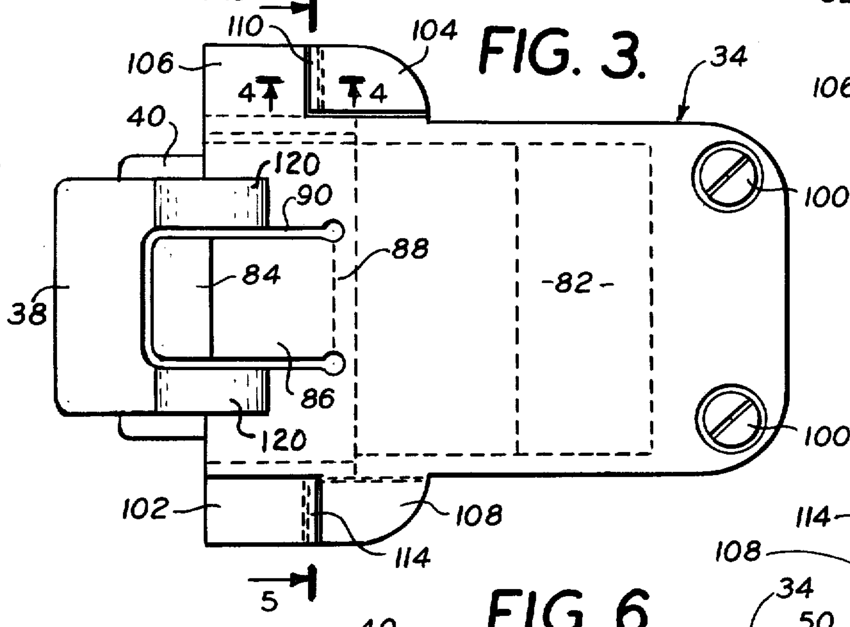
FIG. 3 is a bottom plan view of the construction shown in FIG. 2.

FIG. 3 is a bottom plan view of the lower half 82, and shows a third extension 106 and a fourth extension 108 which are integral and preferably one piece with the lower half 82, and which project all the way up to the top surface of the upper half 80.

At the lower end of the confronting faces of the extensions 106 and 104, there is a projection 110 of the extension 104 overlapping a corresponding depression 112 of the extension 106. This prevents the upper half 80 from moving upward with respect to the lower half 82; and likewise prevents the lower half 82 from moving downwardly with respect to the upper half 80.

At the other side of the connector there is a corresponding projection and groove indicated by the reference character 114. This is at the top of the connector 34 and prevents the upper half 80 from moving downward with respect to the lower half 82, and vice versa.

Figure 5:
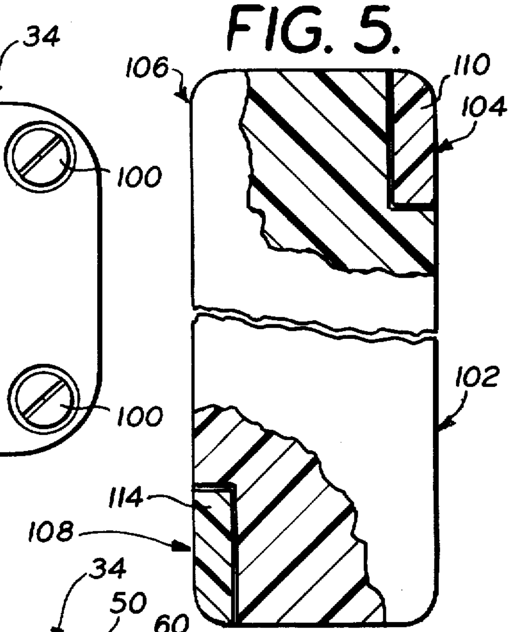
FIG. 5 is a greatly enlarged view, mostly in section along the line 5—5 of FIG. 3, and with the center portion broken away in order to show the construction on a larger scale.

FIG. 5 is a sectional view taken on the line 5—5 of FIG. 6 and on a much larger scale. This section is taken through the protuberances 110 and 114 and shows the way in which they lock the upper and lower halves of the connector shell against movement away from one another in either direction.

No bending of the projections 110 and 114 is necessary to engage them with the corresponding grooves or depressions on the confronting face of the other extension because these engagements can be made before the upper and lower halves of thc shell are connected together at their rearward ends by the bolts 100. The upper and lower halves of the connector shell are preferably molded and made of plastic such as polycarbonate or polyester. The plastic material is tough and resilient enough to avoid being brittle. The connector can be dropped on the floor without breaking.

Some resilience is required for the lower half of the shell in order to obtain hinge action where the tongue 86 of the latch 84 joins the main body of the lower half of the shell. This resilience is necessary to obtain the hinge action for the latch 84 and the construction is much more economical to make if the latch and tongue are part of the same molding as the rest of the lower half of the shell. Two small ramps 116 on the inside of the polarizing tab or handle 26 on the latch side of the shell and curved guide 120 on the outside of the tongue 38 guide the connector and printed wiring card together during engagement. The connector body also "floats" slightly within the confines of the shell to facilitate alignment with the card.

The two tongues 38 and 40, latch 84, ramps 116 and guides 120 are so placed as to provide secure latching to the wiring card with considerable stability to minimize rocking or other motions which would have a harmful effect on the electrical connections, and furthermore, the connector is provided with some clearance all around to the shell so that small motions of the shell from outside forces are not imparted to the connector.

One of the outstanding advantages of the invention is that the parts have the interlocking accessories when molded and the amount of labor involved in the assembly of the connector is reduced to a minimum.

The preferred embodiment of the invention has been illustrated and described, but changes and modifications can be made, and some features can be used in different combinations without departing from the invention as defined in the claims.

What is claimed is:

1. An electrical cable connector for connecting a multiplicity of separately insulated conductors, of a multi-conductor cable, to the corresponding edge contacts of printed wiring cards, including in combination a connector body which houses parallel rows of electrical contacts and circuits connecting said rows of electrical contacts with the respective conductors of said cable, a shell that encloses the connector body, the shell having an open space at the front end thereof for admitting into the connector the edge of a printed wiring card that carries said edge contacts, a tongue extending forward from the connector in position to cooperate with complementary means extending from the card to insure proper polarization of the connector and the contact carrying edge of the wiring card, and a latch extending forward from the connector in position to engage an extension projecting from a wiring card, an attachment forming the latch to the connector by structure that yields as the latch moves with respect to the connector when the latch passes the said extension as the connector is brought into working relation with the card, the attachment being resilient whereby the latch snaps over the back of the extension when the tongue is in cooperating relation with said complementary means of the wiring card for securing the connector to the wiring card with the edge contacts of the printed wiring cards in engagement with the contacts in the connector body.

2. The electrical cable connector described in claim 1 characterized by the connector shell being made in a plurality of parts, the latch being an integral portion of one of said parts, and a connection attaching the latch to the connector and movable to provide hinge movement of the latch with respect to the part of the connector of which the latch is an integral portion, the connection being said attachments joining the latch to the connector.

3. The electrical cable connector described in claim 2 characterized by the part of the shell of which the latch is an integral portion being made of plastic material, and the latch and its connection with the connector being of one piece construction with the portion of the connector to which the latch is an integral part, the plastic material being stiff enough to hold the latch in a predetermined position for contact with the extension, projecting from the printed wiring card, when the connector is brought into contacting relation with the wiring card, said plastic material being resilient enough to flex as necessary to bring the latch into position to hook over the surface of the extension when the wiring card is fully inserted into the connector.

4. The electrical cable connector described in claim 3 characterized by the shell being made in two halves, each of which is a plastic molding, and the latch being of one piece construction with the lower half.

5. The electrical cable connector described in claim 3 characterized by the parts of the shell having interlocking surfaces that hold said parts against movement in a direction that would separate them from one another.

6. The electrical cable connector described in claim 1 characterized by the shell being made of a plurality of parts that fit together, the parts having interlocking portions that prevent the parts from pulling away from one another, other interlocking portions prevent the parts from shifting with respect to one another in one direction, and fastening means for preventing the parts from shifting with respect to one another in another direction.

7. The electrical cable connector described in claim 6 characterized by the shell being made with two parts, extensions on both sides of each part extending in directions to overlie adjacent portions of the other part, near the forward end of the connector, to prevent the parts from moving with respect to one another transversely of the length of the connector, each of the extensions on both sides of each part having a face confronting adjacent to a face on the extension of the other part, grooves and protuberances on the confronting faces in position to prevent relative movement of the parts in a direction away from one another, other interlocking portions of the parts of the shell in position to prevent relative movement of the parts in the direction of the length of the connector, and detaching fastening means near the rearward end of the conductor holding the parts of the shell together and holding the interlocking parts in engagement with one another.

8. An electrical cable connector for connecting a multiplicity of separately insulated conductors, of a multi-conductor cable, to the corresponding edge contacts of printed wiring cards, including in combination a connector body which houses parallel rows of electrical contacts and circuits connecting said rows of electrical contacts with the respective conductors of said cable, a shell that encloses the connector body, the shell having an open space at the front end thereof for admitting into the connector the edge of a printed wiring card that carries said edge contacts, a tongue extending forward from the connector in position to cooperate with complementary means extending from the card to insure proper polarization of the connector and the contact carrying edge of the wiring card, and a latch attached to the connector and extending forward therefrom in position to engage an extension projecting from the wiring card, when the tongue is in cooperating relation with said complementary means of the wiring card for securing the connector to the wiring card with the edge contacts of the printed wiring cards in engagement with the contacts in the connector body, characterized by a printed wiring card having complementary means extending from the card and constituting a handle secured to the printed wiring card with a portion of the handle projecting away from the plane of the card, said portion having an opening through which the tongue extends when the card and connector are oriented with respect to one another for the correct correlation of the respective circuits, the latch being in position to hook over a portion of the handle when the tongue is fully inserted through the opening in the handle.

9. The electrical cable connector described in claim 8 characterized by a second tongue extending forward from the connector on the opposite side of the card from the first tongue, the second tongue having dimensions too large to permit the second tongue to pass through said opening in the handle of the card, and the first tongue having ramps on one side thereof and sloping guides on the other side thereof for guiding the tongue into said opening in the handle and holding the tongue and handle against relative displacement.

10. An electrical cable connector for connecting a multiplicity of separately insulated conductors, of a multi-conductor cable, to the corresponding edge contacts of printed wiring cards, including in combination a connector body which houses parallel rows of electrical contacts and circuits connecting said rows of forward contacts with the respective conductors of said cable, a shell that encloses the connector body, the shell having an open space at the front thereof for admitting into the connector the edge of a printed wiring card that carries said edge contacts, the shell including complementary parts that fit together, the parts including an upper part and a lower part having fastening means at one end of said parts for preventing the parts from moving angularly with respect to one another, and each of the parts having, at the other ends thereof, interlocking portions integral therewith, said interlocking portions including a first extension projecting from one side of the upper part at a forward location thereof and a second extension projecting from the opposite side thereof at a less forward location, both of said extensions projecting downward immediately adjacent to sides of the lower part, a third extension projecting from a side of the lower part on the opposite side of the connector from the first extension and at a forward location on the lower part, a fourth extension projecting from a side of the lower part on the opposite side of the connector from the second extension and at a corresponding less forward location, both of the third and fourth extensions projecting upward immediately adjacent to sides of the upper part, the extensions of both sides of the upper part having faces confronting and adjacent to the extensions of the lower part, and the confronting faces on one side of the connector having horizontally extending overlapping surfaces at the top portions thereof, and the confronting faces on the other side of the connector having corresponding overlapping surfaces at the bottom portions thereof, whereby said extensions prevent movement of said parts, with respect to one another, in any direction having either horizontal or vertical components.

* * * * *